US012785382B2

(12) United States Patent
De Vita et al.

(10) Patent No.: US 12,785,382 B2
(45) Date of Patent: Nov. 3, 2026

(54) METHOD FOR CONTROLLING A PLURALITY OF HALF-BRIDGES AND CORRESPONDING APPARATUS

(71) Applicant: STMicroelectronics International N.V., Geneva (CH)

(72) Inventors: Placido De Vita, Acicatena (IT); Giovanni Luca Torrisi, Catania (IT); Salvatore Abbisso, Augusta (IT); Antonio Davide Leone, Siziano (IT); Gea Donzelli, Varese (IT); Claudio Manconi, Sassari (IT)

( * ) Notice: Subject to any disclaimer, the term of this patent is extended or adjusted under 35 U.S.C. 154(b) by 141 days.

(21) Appl. No.: 18/945,195

(22) Filed: Nov. 12, 2024

(65) Prior Publication Data

US 2025/0202224 A1 Jun. 19, 2025

(30) Foreign Application Priority Data

Dec. 14, 2023 (IT) ........................ 102023000026679

(51) Int. Cl.

| | |
|---|---|
| ***H02H 7/12*** | (2006.01) |
| ***H02H 1/00*** | (2006.01) |
| *H03K 19/20* | (2006.01) |

(52) U.S. Cl.

CPC ............ *H02H 7/12* (2013.01); *H02H 1/0007* (2013.01); *H03K 19/20* (2013.01)

(58) Field of Classification Search

CPC ........ H02M 3/073; H02M 3/10; H02M 3/135; H02M 3/137; H02M 3/28; H02M 3/315; H02M 3/3155; H02M 3/325; H02M 3/335; H02M 7/10; H02M 7/515; H02M 7/521; H02M 7/53; H02M 7/537; H02M 7/5383; H02M 7/538466; H02M 7/53862; H02M 7/5387; H02M 7/53871; H02M 7/53875;

(Continued)

(56) References Cited

U.S. PATENT DOCUMENTS 4,924,158 A * 5/1990 Kelley ................ H02H 7/0838
318/434
5,170,108 A * 12/1992 Peterson ............... E05F 15/603
160/84.02

(Continued)

*Primary Examiner* — Crystal L Hammond
*Assistant Examiner* — Nusrat Quddus
(74) *Attorney, Agent, or Firm* — Slater Matsil, LLP

(57) ABSTRACT

According to an embodiment, a method and circuit for controlling a plurality of half-bridges used to drive loads are provided. The circuit includes output terminals coupled to respective half-bridges, a register bank storing link information indicating which half-bridges are linked, and a decoder. The decoder detects anomalous behavior in a first half-bridge, decodes link information for the first half-bridge to determine linked half-bridges, and generates shut-down signals for the first half-bridge and linked half-bridges. A control unit outputs the shut-down signals to the appropriate half-bridges via the output terminals. The link information may comprise key values or bit patterns indicating links between half-bridges. The decoder may use combinational logic to determine linked half-bridges based on the stored link information. This allows selective shutdown of linked half-bridges upon detecting an anomaly, improving efficiency and reliability when driving loads like electric motors.

20 Claims, 8 Drawing Sheets

(58) Field of Classification Search

CPC ........ H02M 7/757; H02M 7/79; H02M 3/337; H02M 3/338; H02M 3/3382; H02M 3/3384; H02M 7/538; H02M 7/53806; H02M 7/53832; H02M 7/53835; H02M 7/487; H02M 7/539; H02M 7/23; H02M 7/217; H02M 7/21; H02M 7/12; H02M 7/04; H02M 7/00; H02M 1/32; H02M 2001/322; H02M 2001/327; H02M 1/34; H02M 2001/342; H02M 2001/344; H02M 2001/346; H02M 2001/348; H02M 1/36; H02M 1/38; H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; H02M 2001/4291

See application file for complete search history.

(56) References Cited

U.S. PATENT DOCUMENTS

| | | | | |
|---|---|---|---|---|
| 5,856,736 | A * | 1/1999 | Rotunda | H02P 29/40 318/811 |
| 10,447,174 | B1 * | 10/2019 | Porter, Jr. | H02M 7/497 |
| 10,720,919 | B2 | 7/2020 | Zhou et al. | |
| 2007/0075657 | A1 * | 4/2007 | Moller | H02P 7/29 318/77 |
| 2014/0347103 | A1 | 11/2014 | Snook et al. | |
| 2015/0023080 | A1 | 1/2015 | Chambon | |

* cited by examiner 410
420
L12
L13
L23
422
R1
R2
R3
HB3
HB2
HB1
400

METHOD FOR CONTROLLING A PLURALITY OF HALF-BRIDGES AND CORRESPONDING APPARATUS

CROSS-REFERENCE TO RELATED APPLICATIONS

This application claims the benefit of Italian Application No. 102023000026679, filed on Dec. 14, 2023, which application is incorporated by reference herein in its entirety.

TECHNICAL FIELD

The embodiments of the present disclosure relate to a method for controlling a plurality of half-bridges, the control comprising, upon occurring a given condition, in particular a failure condition, performing a shut-down of at least a half-bridge in the plurality of half-bridges. In embodiments, these solutions are applied to control half-bridge driving in H-bridge configuration loads such as driving electrical motors.

BACKGROUND

A pre-driving stage that controls the operation of one or more external switches, which in turn drive a load, e.g., the motor of an actuator, is known. In particular, it is well known to have switches in the configuration of H-bridges or half-bridges to drive a load; their control signals, in particular, are supplied to their control electrode by a pre-driving stage.

Here, the pre-driver or pre-driving stage is intended as an integrated circuit controlling and driving a power stage, comprising one or more external switches, particularly in H-bridge configuration, not embedded in the same integrated circuit, i.e., in the same chip. Therefore, an external switch is intended for a switch belonging to a circuit arrangement differently packaged concerning the pre-driving stage, i.e., on another integrated circuit or chip. In the automotive field, this arrangement with a pre-driving and the power stage, i.e., the external switch on different chips, may occur with several actuators using DC electric motors.

The solutions known in the art can either shut down the entire plurality of half-bridges or shut down only the defective half-bridges through, for example, the driving stage.

These solutions, however, do not allow the selection and deactivating of half-bridges among a plurality of half-bridges, enabling shutting down a designated subset of half-bridges in case of failure instead of shutting down the whole plurality of half-bridges connected to a pre-driving stage or shutting down the faulty half-bridges only.

SUMMARY

Considering the preceding, an object of various embodiments of the present disclosure is to provide solutions that can overcome one or more of the limits of the prior art.

According to one or more embodiments, a selective fail-safe method for H-bridges with distinctive elements specified in the ensuing claims achieves one or more of the previous objects.

Various embodiments of the present disclosure regard a method for selecting, among a plurality of half-bridges connected to a pre-driving stage, a subset of half-bridges and for shutting down the half-bridges chosen in case one or more of them show an anomalous behavior.

To achieve the desired effect, the solution described here refers to a method for controlling a plurality of half-bridges, comprising, if it is requested, shutting down at least a half-bridge in the plurality of half-bridges, the method comprising the steps associating values to each half-bridge connected to the pre-driving stage, grouping the half-bridges according to the associated values and shutting down, in case an anomaly is detected, the desired subset of half-bridges, i.e., the subset of half-bridges driving a faulty load or a subset of half-bridges driving a load wherein a half-bridge is faulty, for example.

DETAILED DESCRIPTION OF ILLUSTRATIVE EMBODIMENTS

In the ensuing description, various specific details are illustrated, aimed at providing an in-depth understanding of the embodiments. The embodiments may be provided without one or more of the specific details or with other methods, components, materials, etc. In other cases, known structures, materials, or operations are not illustrated or described in detail so that various aspects of the embodiments will not be obscured.

Reference to "an embodiment" or "one embodiment" in the framework of the present disclosure is intended to indicate that a particular configuration, structure, or characteristic described concerning the embodiment is comprised of at least one embodiment. Hence, phrases such as "in an embodiment" or "in one embodiment" that may be present in various points of this description do not necessarily refer to the same embodiment. Moreover, particular conformations, structures, or characteristics may be combined in any adequate way in one or more embodiments. The references used herein are provided only for convenience and do not define the sphere of protection or the scope of the embodiments.

As explained previously, various embodiments of the present disclosure regard a pre-driving stage implementing a selective fail-safe method for H-bridges. To this end, in FIG. 1, it is shown an apparatus 100 comprising a driving stage 101 configured to drive a plurality of half-bridges HB1 . . . HB8, or in general HB1 . . . HBN if there are N half-bridge circuits, collectively indicated by reference 105. Generally, in a way known per se, a half-bridge comprises a high-side switch and a low-side switch, which are driven in their opening and closing state by control signals issued, for example, by the driving stage 101. Such switches may be solid-state devices such as bipolar transistors, bipolar junction transistors (BJTs), insulated gate bipolar transistors (IGBTs), field-effect transistors (FETs), or metal oxide semiconductor field effect transistors (MOSFETs).

Figure 1:
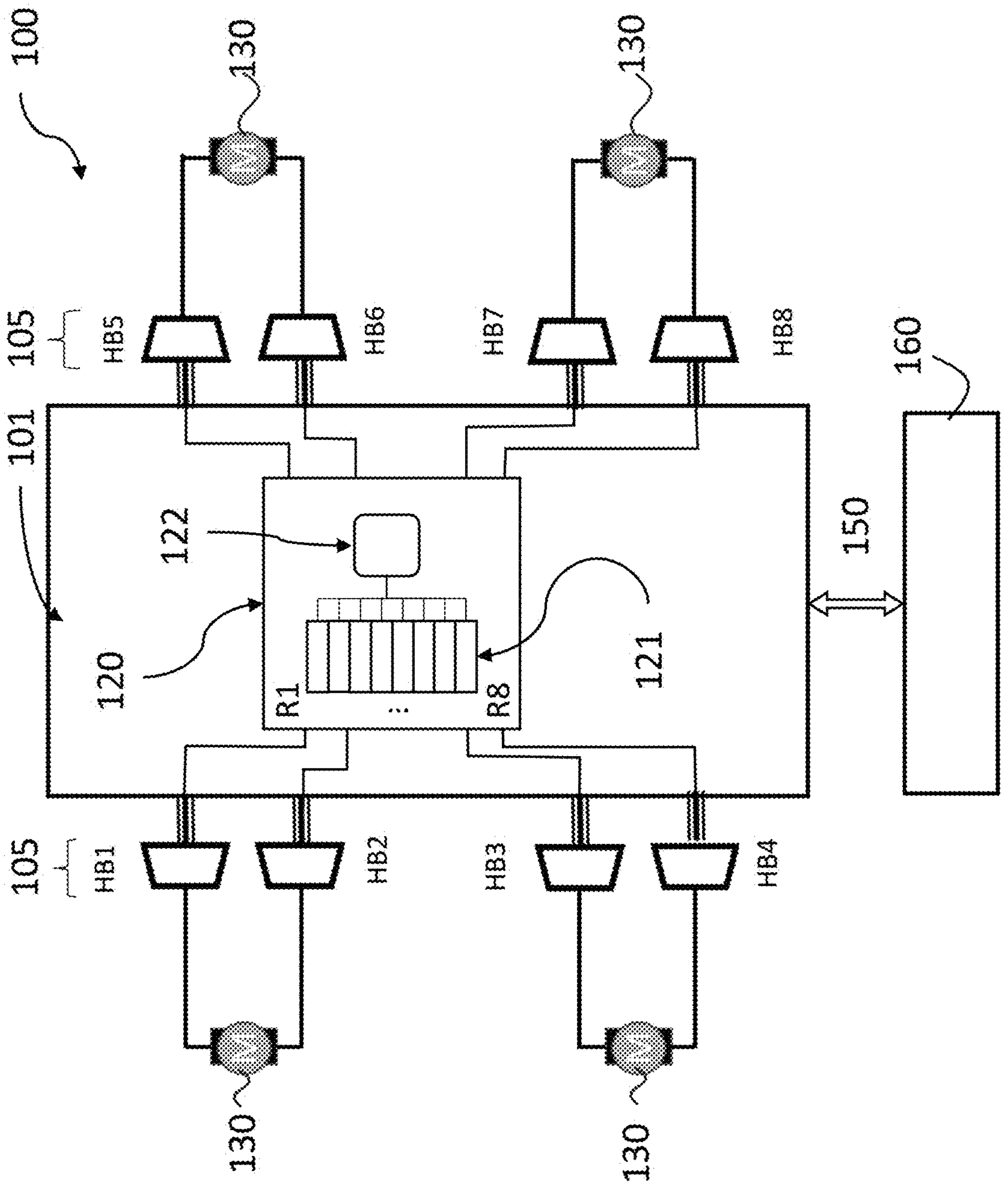
FIG. 1 shows a block schematic representing an embodiment of an apparatus according to the solution here described.

The half-bridges HB1 . . . HB8 are in the exemplary embodiment arranged in pairs, as shown in FIG. 1, to form H-bridges for driving a respective load 130, which in the example is embodied by an electric motor, by its two terminals. The driving stage 101 is configured to supply driving signals to the control electrodes of the switches, i.e., to the base electrode of a BJT or to the gate electrode of an IGBT or FET.

The driving stage 101 comprises a logic circuit 120, configured to implement a method by the solution described here, particularly performing linking and decoding operations. As described in the following, the logic circuit 120 is configured to couple multiple half-bridges together, to allow switching off a desired subset of half-bridges within the plurality of half-bridges HB1 . . . HB8. Such a subset can also correspond to the whole plurality of half-bridges HB1 . . . HB8. As shown in FIG. 1, which further details such logic circuit 120 configured to decode and link, circuit 120 comprises a plurality of registers, collectively indicated with the reference 121, R1 . . . R8 associated to the corresponding half-bridges HB1 . . . HB8, designed to store as link information a respective key value K associated with each half-bridge HB1 . . . HB8.

As described in the following, the key values K in such registers R1 . . . R8 define how the respective half-bridges HB1 . . . HB8 are linked concerning a given operation, controlled by the pre-driving stage 101, specifically a shutdown operation, according to the format in which the values K are stored and to the decoding modes implemented in the logic circuit 120, for example, in a logic sub-circuit or sub-circuit 122, as shown in FIG. 1, whose configuration may vary according to the various embodiments and will be presented in the following.

In embodiments, an external controller controls the driving stage 101. FIG. 1 is equipped with a Serial Peripheral Interface (SPI), indicated with 150, through which the driving stage 101 can exchange data and control information with an external microcontroller 160.

Figure 2:
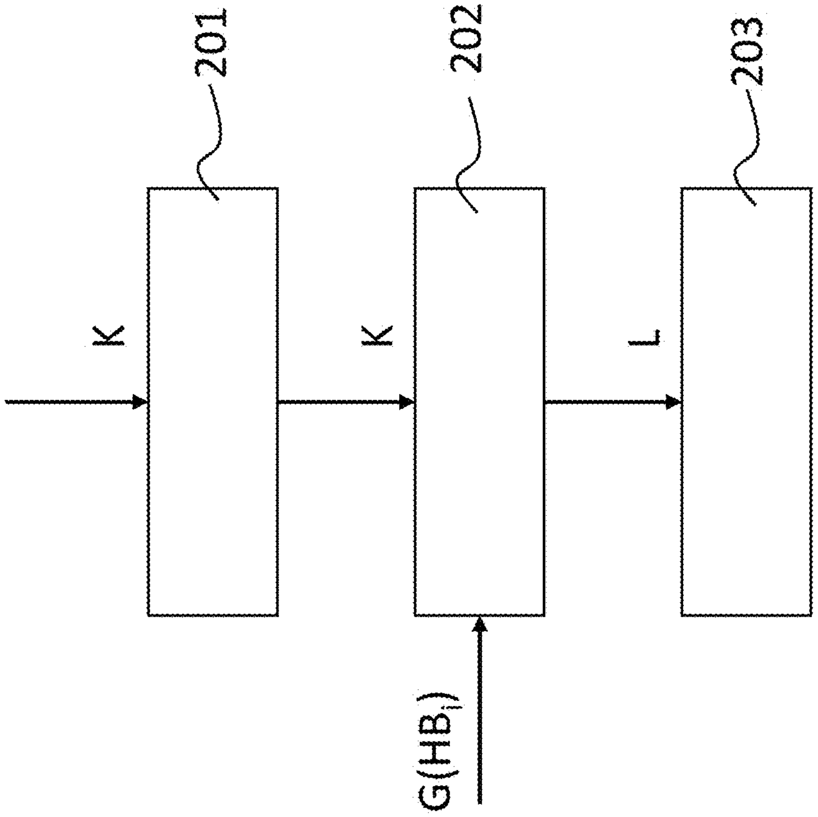
FIG. 2 shows a flow diagram representing an embodiment of a method for controlling a plurality of half-bridges according to the solution here described.

Concerning FIG. 2, the driving stage 101 implements a method, indicated as a whole with the reference 200, for controlling a plurality of half-bridges, such as HB1 . . . HB8, which comprises a step 201 of associating to each half-bridge $HB_i$, where i is an index designating a specific half-bridge in the plurality HB1 . . . HB8, of the plurality of half-bridges HB1 . . . HB8, a corresponding register $R_i$ in the plurality of registers R1 . . . R8 in the logic circuit 120, storing a respective key value K, i.e. a link information indicating which other half-bridge or half-bridges in the plurality of half-bridges HB1 . . . HB8 is linked to the half-bridge $HB_i$, i.e., linked to execute a shut-down. Such key value K specifies a link between such half-bridge $HB_i$ and any other half-bridges in the plurality of half-bridges, HB1 . . . HB8.

Then, upon the occurrence of a given condition, such as an anomaly of at least a given half-bridge, e.g., $HB_i$, requiring shut down, indicated with G ($HB_i$), it is performed a step of decoding 202 such value K, using the logic circuit 120 to obtain such link, indicated with Lin FIG. 2, between such half-bridge $HB_i$ and any of the other half-bridges in the plurality of half-bridges HB1 . . . HB8. As better explained in the following, the value K in the registers R1 . . . R8 may represent such link L by its position in the register, which is then decoded by circuit 120, or may represent a pointer, e.g., an address to another half-bridge in such plurality which is then acquired by the circuit 120 to evaluate the link which represents, or may represent a key value representing an identifier of the half-bridge which may be acquired by the circuit 120 to compare with possible other identifiers to evaluate the link information L which represents.

In embodiments, the decoding circuitry is combinatory; thus, the link information L, particularly decoded linking information L, may be available once the configuration in the registers is set or changed.

Then, an operation of shutting down 203, such as any other half-bridge linked to such half-bridge $HB_i$ according to the obtained, i.e., decoded link information L, is performed. It is underlined that the value K may also indicate that no other half-bridge is linked to the half-bridge storing the value K, which is decoded.

Figure 3:
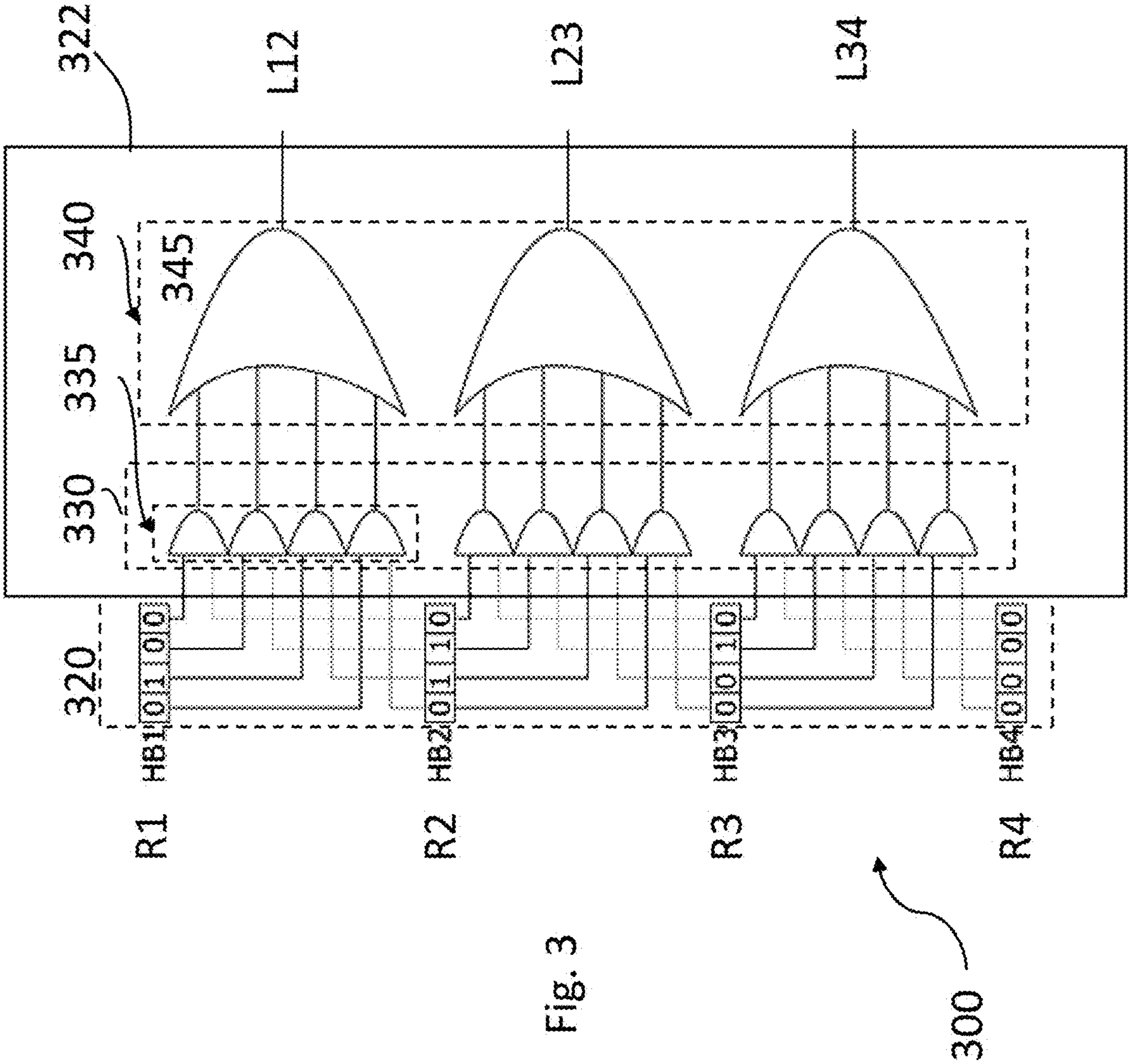
FIG. 3 shows schematically a first embodiment of a logic circuit according to the solution here described.

In one exemplary preferred embodiment, illustrated in FIG. 3, an embodiment of the logic circuit 122, indicated with 300, using registers 320 storing keys K, in particular representing identifiers, for grouping the half-bridges in subsets with the same key value K is shown. The logic circuit 300 comprises a decoder logic circuit 322, embodying the logic circuit 122, comprising a plurality of AND gates 330 and a plurality of OR gates 340. In the exemplary embodiment illustrated in FIG. 3, the driving stage 101 is associated with eight half-bridges HB1 . . . HB8 is associated with respective registers R1 . . . R8, each register R1 . . . R8 storing a respective key K.

However, FIG. 3 shows a reduced set comprising only four half-bridges HB1 to HB4. Such grouping half-bridges with keys K provides assigning to the half-bridges that are meant to be linked to the same key K or identifier, i.e., a value represented as a binary number. In particular, in each key K, represented by a binary string, only a single bit equals '1', and the remaining bits are equal to '0'.

Given the above, the number of bits necessary to represent the keys K is equal to the number of keys K used by the method, corresponding to half the number of half-bridges. In the exemplary embodiment of FIG. 3, there are 8 half-bridges, only four of which are illustrated for simplicity. Thus, a subset of four keys with binary strings of four digits equal to, respectively, '0001', '0010', '0100', and '1000' may be selected. A further "no key" value may be added to the subset, for example, with the value '0000', which cannot result in the sum of any combination of the previous values, to indicate that the half-bridge storing it is not linked to any other one, e.g., if it is shut down, it is shut down alone.

By further way of example, if the plurality of half-bridges comprises 4 half-bridges, the number of bits in a register is 2, and the possible keys are "01" and "10". In general, thus, it is stored as link information, e.g., as value K, using registers $R_i$, having a length of at least half of the number N of half-bridges, a key value, or more key values K belonging to a set of keys $K_0 \ldots K_{N/2}$, comprising correspondingly a number of keys half of the number N of half-bridges where, for example, $K_0$ may correspond to the "no key" value, e.g., '0000', while each other key in the set $K_0 \ldots K_{N/2}$ has a single binary digit asserted, in the example to logic one, different from any other key in the set of keys.

Storing a key K with the same value in the respective registers is sufficient to link multiple half-bridges together.

Each half-bridge can store multiple keys so that a half-bridge can be shut down if an anomaly occurs in two different subsets of half-bridges to which the half-bridge is linked. Since each key K is represented using only one bit with a value equal to '1', the same register may contain multiple keys, such as, for example, '0001' and '0100', by containing the sum of the two values, '0101' for example.

Logic circuit 300 exploits the plurality of AND gates 330 and OR gates 340 to verify whether two or more half-bridges are linked and arranged to form a combinational logic circuit.

For each i-th register $R_i$ associated with a half-bridge, it is provided a number of AND gates among AND gates 330 corresponding to the number of bits contained in the i-th register $R_i$, e.g., N/2, arranged in subsets 335. Each subset of AND gates 335 is configured to check the link between a pair of half-bridges among the plurality of half-bridges, namely $HB_i$.

Thus, by indicating with N the total number of half-bridges, each register associated with a half-bridge is connected to (N−1) subsets of AND gates 335, each one of the subsets 335 containing, as stated above, a number of AND gates equal to the number of bits in each register, thus enabling a bitwise AND operation. Each register $R_i$, associated to a half-bridge $HB_i$, is thus coupled to a total number of NB×N AND gates, where NB is the number of bits of the register and N is the number of half-bridges of the system.

The link may be independent of the position of a half-bridge $HB_i$. For example, HB1 can be linked to HB5 as well. FIG. 3 illustrates only some examples of the links between the HB to give an idea of the decode logic. Each AND gate of the subset 335 receives two input signals, a first signal corresponding to a bit of a first register $R_i$, at a certain position defined within the register $R_i$, associated to a first half-bridge, and a second signal corresponding to a bit, taken at the same position of the first bit, of a second register $R_j$ associated to a second half-bridge i.e., the registers of a pair of half-bridges.

If the bits stored at the same position of different registers are both equal to '1', i.e., if the different registers store the same key, the result of the AND operation between the two bits returns '1'.

An OR gate 345 receives the output signals coming from the subset of AND gates 335 associated to a pair of registers, and returns an output signal equal to the logical OR operation of the input signals. Thus, each OR gate 345 has a number of inputs equal to the number of bits in each register. By indicating with N the total number of half-bridge, a total number of N×(N−1) OR gates may be necessary to check all the possible couplings between the half-bridge of the pre-driving stage.

However, a further optimization can be achieved, since some links share the same decoding logic (for example, with reference to the notation below, $L_{12}=L_{21}$, where a link information of i-th bridge HBi to j-th bridge HBj is indicated by $L_{ij}$), the real number of OR gates can be obtained using the formula $$\#OR = \binom{N}{2} = \frac{N!}{2!\cdot(N-2)!}$$

with #OR equal to the number of OR gates and N equals to the number of half-bridges HB. For example, a simple case with 4 HB will have $$\#OR = \binom{4}{2} = \frac{4!}{2!\cdot(4-2)!} = \frac{4!}{2!\cdot 2!} = \frac{3\cdot 4}{2!} = 6,$$

corresponding to the six possible links L12, L13, L14, L23, L24, L34. Multiplying the number of OR gates #OR by the size of the keys it is possible to obtain the total number of AND gates (as single gate, not as subset of gates). The total number of AND subsets equals the number of OR gates.

In this example, the output of the OR gate 345 is asserted high if at least one of the input bits is asserted, i.e., if the registers corresponding to the half-bridges of which the linking is checked have at least one bit asserted at the same position.

In the example shown, register 320 of HB1 contains the key K '0100', register 320 of HB2 contains the key K '0110', register 320 of HB3 contains the key K '0010' and register 320 of HB4 contains the key K '0000', thus the OR gate 345 coupled to subset of AND gates 335 coupled to the registers of half-bridges HB1 and HB2 outputs a link information $L_{12}$ indicating that HB1 and HB2 are linked. The OR gate 345 coupled to subset of AND gates 335 coupled to the registers of half-bridges HB2 and HB3 outputs a link information L23 indicating that HB2 and HB3 are also linked. In general, in the present description a link information of i-th bridge HBi to j-th bridge HBj is indicated by Lij.

It is underlined that if the keys in the set $K_0 \ldots K_{N/2}$ has the single binary digit asserted to logic zero; the decoding linking circuit 300 of FIG. 3 may be embodied, for example, changing the AND gates with NOR gates, as the AND gate has high output when both inputs are high, NOR gate has high output when both inputs are low. Thus, the step of decoding 202 in variant embodiments may comprise performing bitwise NOR, instead of AND 330, logic operation between the one or more keys K stored in respective registers of a pair of half-bridges i.e., the method here disclosed may comprise performing AND or NOR operations as stage 330, depending on the logic value asserting the link in the binary digits of the keys.

It is also noted that the linking circuit 300 of FIG. 3 in variant embodiments can achieve the same functionalities, for example, using only NAND gates, using De Morgan's Law.

Also, in variant embodiments, to change the type of assertion of the link information L at the output, e.g., changing from logic zero, meaning no link, to meaning link, it is sufficient to change the OR gates with NOR gates as an example.

This solution not only allows selecting which half-bridge to shut down but also has the advantage that it requires a reduced number of bits with respect to the other embodiments described here. It requires a simple combinational logic circuit to implement the logic circuit 300 performing the decoding and linking. This solution requires a reduced amount of die area to implement the described method.

Figures 4A, 4B, 4C:
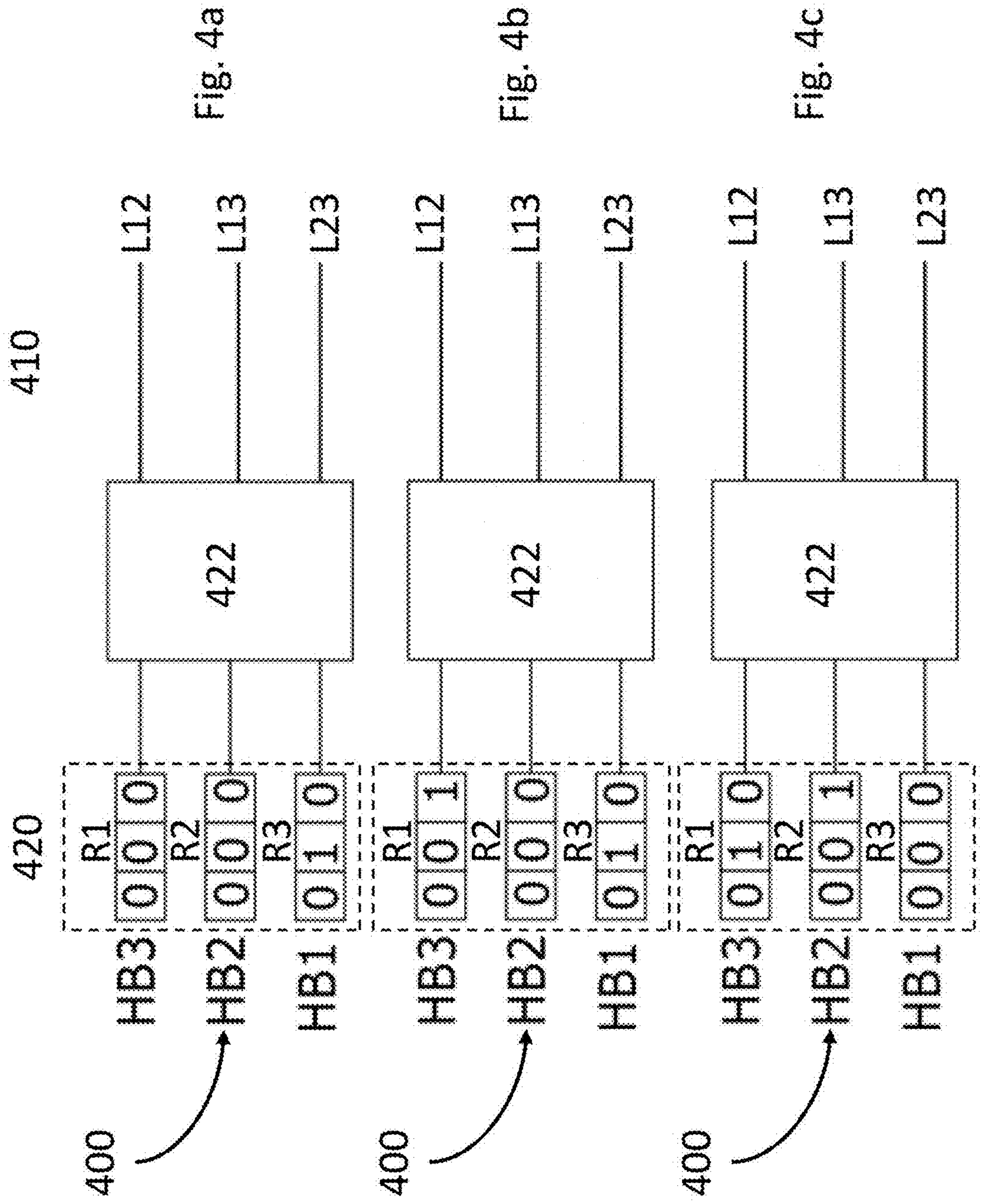
FIG. 4*a* shows schematically a second implementation of a decoding and linking circuit according to the solution here described.
FIG. 4*b* shows a further schematic representation of the decoding and linking circuit of FIG. 4*a;*
FIG. 4*c* shows a further schematic representation of the decoding and linking circuit of FIG. 4*a;*

A further embodiment, illustrated in FIGS. 4*a*, 4*b*, and 4*c*, shows a logic circuit 400 using direct half-bridge indexing. The logic circuit 400 comprises a plurality of registers 420 and a logic circuit 422 to decode the value K.

The logic circuit 400 comprises eight half-bridges HB1 . . . HB8 is associated with respective registers R1 . . . R8, of which only three are shown here for simplicity's sake.

Regarding FIG. 4*a*, the register R1, associated with the half-bridge HB1, stores a binary number N1, '010', i.e., an address pointing at the half-bridge HB3, to which this address is associated. The register R2, associated with the half-bridge HB2, stores a binary number N2, '000', i.e., an address pointing at the half-bridge HB1. The register R3, associated with the half-bridge HB3, stores a binary number N3, '000', i.e., an address pointing at the half-bridge HB1.

In this embodiment, the decoding and linking circuit 422 comprised in the logic circuit 400 is configured to rebuild the chain of all the linked half-bridges that is subjected to the same action, e.g., switched off, i.e., shut down, simultaneously. Since each register associated with a half-bridge can store a value pointing to one and only one other half-bridge, the overall linking relationships between the half-bridges must be constructed sequentially by such decoding and linking circuit 422.

The binary numbers N1, N2, and N3 are sent as input to the decoding and linking circuit 422, which constructs the complete linking relationships of the half-bridges coupled to the pre-driving stage. The decoding and linking circuit 422 outputs the linking relationships, indicating, for example, by a link information L13 outputted by such decoding and linking circuit 422, that half-bridge HB1 is linked to half-bridge HB3, half-bridge HB2 is linked to half-bridge HB1 (link information L12). Half-bridge HB3 is linked to half-bridge HB1 as well; thus, HB2 is linked to HB3, as indicated in link L23. By applying transitive property, it follows that the half-bridges HB1, HB2, and HB3 are linked together and are consequently turned off simultaneously when required.

Thus, the direct half-bridge indexing provides associating to each half-bridge, in particular its port receiving the control signals from the driving stage, a value K, represented as a binary number, and storing in a register $R_i$ associated to a i-th half-bridge $HB_i$ a value corresponding to the address of another half-bridge $HB_j$ linked to the half-bridge, in such a way that each register associated to a half-bridge contains the address of the linked half-bridge.

FIG. 4*b* shows a different configuration of the values K in the three registers of FIG. 4*a*. Here, the register R1, associated with the half-bridge HB1, stores a binary number N1, '010', pointing at the half-bridge HB3. The register R2, associated with the half-bridge HB2, stores a binary number N2, '000', pointing at the half-bridge HB1. The register R3, associated with the half-bridge HB3, stores a binary number N3, '001', pointing at the half-bridge HB2.

The binary numbers N1, N2, and N3 are sent as input to the decoding and linking circuit 422, which constructs the linking relationships of the half-bridges coupled to the driving stage. The decoding and linking circuit 422 outputs the linking relationships, indicating that half-bridge HB1 is linked to half-bridge HB3 (L13), half-bridge HB2 is linked to half-bridge HB1 (L12), and half-bridge HB3 is linked to half-bridge HB2 (L23). Thus, by applying cyclic association and transitive property, the half-bridges HB1, HB2 and HB3 are linked and turned off simultaneously.

If there is no need to link multiple half-bridges together, it is possible to leave them independent by storing in the respective registers an address value that points at the same half-bridge to which the register $R_i$ is associated.

In the configuration of FIG. 4*c*, the register R1, associated with the half-bridge HB1, stores a binary number N1, '000', pointing at the half-bridge HB1. The register R2, associated with the half-bridge HB2, stores a binary number N2, '001', pointing at the half-bridge HB2. The register R3, associated to the half-bridge HB3, stores a binary number N3, '010', pointing at the half-bridge HB3.

In this case, the register configuration shows that HB1, HB2, and HB3 are disconnected. Thus, the decoding and linking circuit 422 indicates that each half-bridge $HB_i$ is linked to itself and not linked to other half-bridges. Link information L12, L13, and L23 indicate this. For example, each link information is logic zero, while if a link was present, e.g., between HB1 and HB2, the corresponding link information L12 would be logic one.

This solution requires fewer bits to index the plurality of half-bridges; in fact, for each register, a number of bits corresponding to the binary logarithm of the total number of half-bridges is sufficient.

Figure 6A:
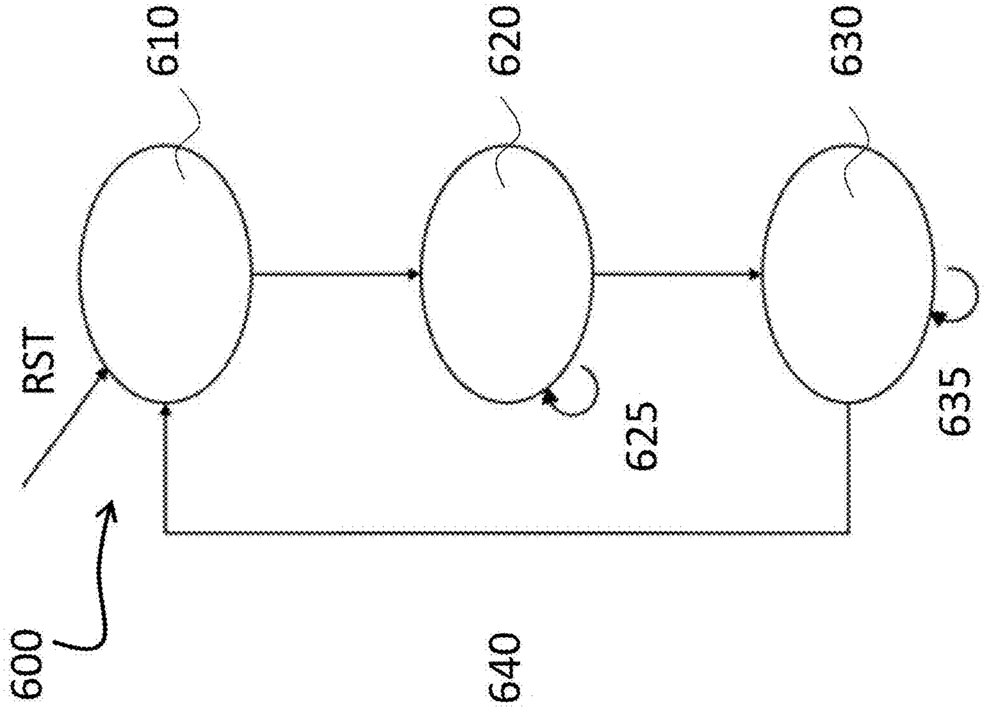
FIG. 6*a* shows a detailed representation of the decoding and linking circuit of FIGS. 4*a*, 4*b*, 4*c*.

The decoding and linking circuit 422 of the present embodiment is now described in further detail. In this regard, in FIG. 6*a*, an exemplary flow diagram 600 is shown, indicating a procedure to obtain the link information in the form of a link matrix 660, implemented by the decoding and linking circuit 422, according to the embodiment described here. For the sake of simplicity, the examples here illustrated refer to a system driving only four half-bridge stages; thus, in accordance with the description in the preceding, the required number of bits required in register 420 to represent the linking information for each half-bridge stage is two, i.e., the binary logarithm of the number of half-bridges connected.

Upon receiving a reset command RST in the first step 610, the decoding and linking circuit 422 accesses the values K stored in the register 420. This is indicative of the linking between a half-bridge HBi and a half-bridge HBj, where i is the position of the value K in the register 420 and j is equal to the linked half-bridge index minus one, i.e., j=N−1.

Step 610 further comprises initializing a matrix 660 with dimension N×N, with N being the number of half-bridges the system is designed to control; such matrix 660 comprises within the decoding and linking circuit 422. The initialization of the matrix 660 comprises filling with '0' the off-diagonal cells and filling with '1' the cells on the diagonal. The content of the register 420 and the matrix 660 after the first step 610 is reported in the tables below.

REGS

| | | |
|---|---|---|
| HB1 | 0 | 1 |
| HB2 | 1 | 0 |
| HB3 | 0 | 0 |
| HB4 | 1 | 1 |

HBx Matrix

| | | | |
|---|---|---|---|
| 1 | 0 | 0 | 0 |
| 0 | 1 | 0 | 0 |
| 0 | 0 | 1 | 0 |
| 0 | 0 | 0 | 1 |

Table REGS represents the contents of the register 420, each row representing a half-bridge HBi, comprising a two-bit binary value K, a value for each column. Table HBx Matrix represents the matrix 660 as described above, each row representing a half-bridge HBi, with four columns corresponding to the four values of the binary string corresponding to the half-bridge of that row.

In a second step 620, the values K are read from the register 420, one at a time. In case the value K indicates that a half-bridge HBi is linked with a half-bridge HBj, the decoding and linking circuit 422 will write in the matrix 660 a value '1' at the i-th row and j-th column.

Referring to the tables above, the values K stored in register 420 are read by the decoding and linking circuit 422, starting from the first position of the register, corresponding to HB1. In the example shown, the first position of the register contains value '01', meaning that the half-bridge HB1 is linked to the half-bridge HB2. Consequently, the decoding and linking circuit 422 writes a logical '1' value at the first row and second column of the matrix 660 (table Create Row1 below, which represents matrix 660 after this first operation), thus indicating that the half-bridge HB1, indicated by the row index of the matrix, is linked with the half-bridge HB2, indicated by the column index of the matrix.

As indicated by cycle arrow 625, this operation is repeated for each half-bridge (tables Create Row2, Create Row3, and Create Row4 indicating the next three repeats of the operation); this is determining, thus starting from HB1 to HB4 in the example shown.

At the end of the second step, 620, matrix 660 contains the linking information extracted from register 420 and is necessary for reconstructing the complete linking relationships between the plurality of half-bridges.

| Create Row1 | | | |
|---|---|---|---|
| 1 | 1 | 0 | 0 |
| 0 | 1 | 0 | 0 |
| 0 | 0 | 1 | 0 |
| 0 | 0 | 0 | 1 |

| Create Row2 | | | |
|---|---|---|---|
| 1 | 1 | 0 | 0 |
| 0 | 1 | 1 | 0 |
| 0 | 0 | 1 | 0 |
| 0 | 0 | 0 | 1 |

| Create Row3 | | | |
|---|---|---|---|
| 1 | 1 | 0 | 0 |
| 0 | 1 | 1 | 0 |
| 1 | 0 | 1 | 0 |
| 0 | 0 | 0 | 1 |

| Create Row4 | | | |
|---|---|---|---|
| 1 | 0 | 0 | 0 |
| 0 | 1 | 1 | 0 |
| 1 | 0 | 1 | 0 |
| 0 | 0 | 0 | 1 |

Subsequently, in step 630, the matrix 660 is iteratively symmetrized, starting from the first row. Iteration, i.e., repetition, is indicated by cycle arrow 635. Specifically, the operation of symmetrizing a matrix comprises changing values from '0' to '1', and not vice-versa, in each row of the matrix, in such a way that the resulting matrix is symmetrical i.e., having the i-th row equal to the i-th column. In a first iteration of such operation, as shown in the example, the value located at the first row and third column of the matrix 660 is changed from '0' to '1', in such a way that it is equal to the value stored at the third row and first column of the matrix 660. It must be noted that, as mentioned in the foregoing, only the cells containing values equal to '0' can be changed to '1', whereas cells containing '1' values cannot be changed to '0'. Similarly, in a second iteration of the step 630, the value stored in the cell located at the second row and first column of the matrix 660 is changed from '0' to '1'; in a third iteration of the step 630, the value stored in the cell located at the third row and second column of the matrix 660 is changed from '0' to '1' and, finally, in a fourth iteration of the step 630, no further changes are needed since the fourth row is already equal to the fourth column of the matrix 660. Tables Sym Row1, Sym Row2, Sym Row3, Sym Row4 show matrix 660 after each symmetrization operation.

| Sym Row1 | | | |
|---|---|---|---|
| 1 | 1 | 1 | 0 |
| 0 | 1 | 1 | 0 |
| 1 | 0 | 1 | 0 |
| 0 | 0 | 0 | 1 |

| Sym Row2 | | | |
|---|---|---|---|
| 1 | 1 | 1 | 0 |
| 1 | 1 | 1 | 0 |
| 1 | 0 | 1 | 0 |
| 0 | 0 | 0 | 1 |

| Sym Row3 | | | |
|---|---|---|---|
| 1 | 1 | 1 | 0 |
| 1 | 1 | 1 | 0 |
| 1 | 1 | 1 | 0 |
| 0 | 0 | 0 | 1 |

| Sym Row4 | | | |
|---|---|---|---|
| 1 | 1 | 1 | 0 |
| 1 | 1 | 1 | 0 |
| 1 | 1 | 1 | 0 |
| 0 | 0 | 0 | 1 |

A step 640 may then save the symmetrized matrix and then go back to step 610 for a restart, in particular upon receiving a reset signal RST.

Figure 6B:
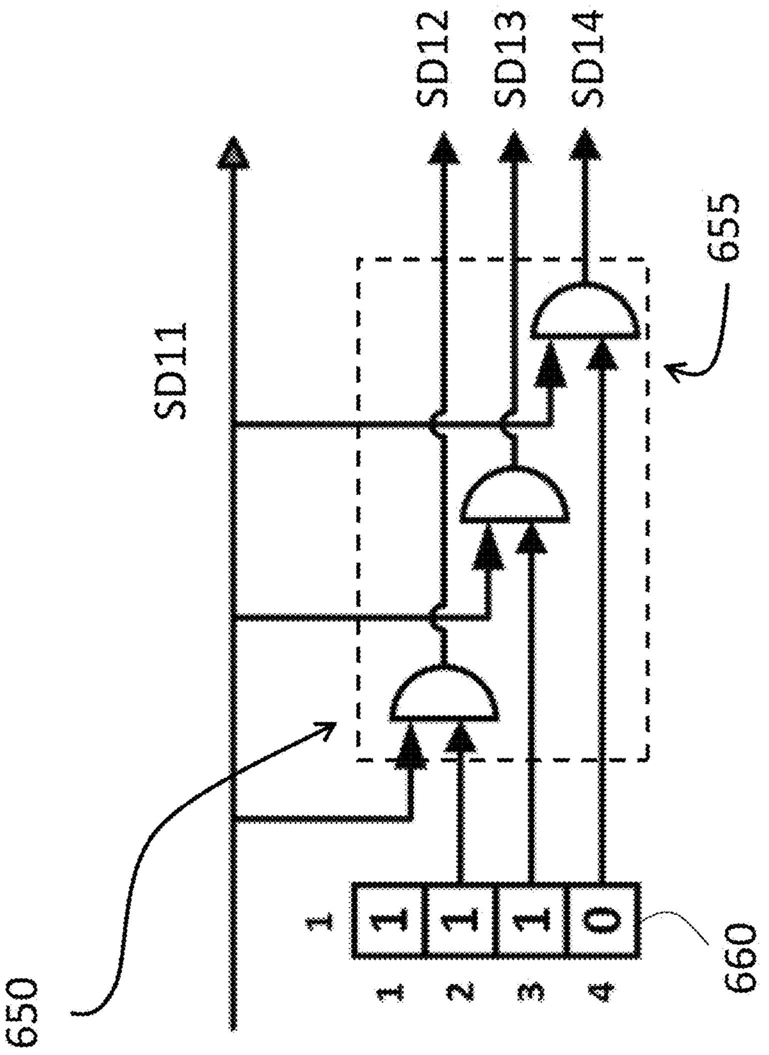
FIG. 6*b* shows a schematic of a combinational circuit comprised in the decoding and linking circuit.

In the exemplary embodiment considered, the decoding and linking circuit 422 further comprises a combinational circuit 650, as shown in FIG. 6*b*, comprising a plurality of AND gates and configured to check the linking relationships among the plurality of half-bridges. In particular, the combinational circuit 650 comprises a number of AND gates 655 equal to the number of half-bridges supported by the system minus one, N−1, i.e., three in the example shown. Each AND gate receive two input bits: a first input bit asserting whether a specific half-bridge is to be shut down and a second input bit coming from the matrix 660, namely of a column indicating the linking of a specific half-bridge, indicated by the column index, in the example 1 for HB1, with the other half-bridge, for which the link must be evaluated, indicated by the row index. It is important to note that for each column of matrix 660, there is a bit that is not connected to the combinational network 650, which is the bit on the row of the specific half-bridge since there is no need to check the linking between a half-bridge and itself.

The output of the AND gates 655, based on the link information contained in the relevant column of the link matrix 660, supplies respective shutdown commands in binary form, SD12, SD13, SD14, indexes beings chosen in the same way as decoded link information L12, L13, L14.

Thus, the procedure 600 for obtaining the link information as a link matrix e.g., 660, may be summarized as comprising the steps of: accessing 610 the link information values K stored in the register 420 e.g., the two-bit binary values in such register 420, initializing a square matrix 660, as shown for example initialization meaning filling with zeroes the matrix 660 to the exception of positions on the diagonal; reading 620 the link information values K from the register 420, one at a time, i.e. a row at time, and writing, asserting a bit value, in the example assertion meaning logic one, at the row and column corresponding to a link information value indicating a link between two given half-bridges, thus position (i,j) for half-bridges $HB_i$ and $HB_j$, repeating the operation for each value, namely each row, in the register 420, performing 630 an iterative symmetrization of the matrix 660, row by row, such symmetrization comprising changing only not asserting logic values, in the example particular logic zero, in the opposite logic values i.e., logic one, and maintaining asserting logic values, in particular logic one, in other words in the example the zeroes are changed to one and the ones are maintained.

Optionally the procedure may include saving 640 the symmetrized matrix 660 and returning to the accessing step 610, in particular upon receiving a reset signal RST.

The values stored in the matrix 660 are read by the combinational circuit 650, receiving as input bits each column of the matrix 660. In the example illustrated in FIG. 6*b*, when a signal SD11 indicating that the shut-down of half-bridge HB1 is required has a logic high value, the network of AND gates 655 of the combinational circuit 650 returns shutdown commands SD12, SD13, SD14, whether the remaining half-bridges HB2 . . . HB4, indicated by respective row indexes, are required to be shut down along with half-bridge HB1. In the example, the half-bridges HB2 and HB3 are shut down i.e., shutdown commands SD12 and SD13 equals to one, since the first column of the matrix indicated that the half-bridge HB1 is linked to HB2 and HB3. Conversely, the half-bridge HB4 is not shut down in case of fault of HB1 because the matrix indicates that it is not linked to HB1 and then the combinational circuit does not return a signal indicating to shut down such half-bridge, namely shut down command SD14 is asserted to logical zero.

In various embodiments, the decoding and linking circuit 422 may be implemented by means of a finite state machine (FSM) or, alternatively, with a microcontroller circuit.

This approach requires a more complex decoding and linking circuit, with respect to the other embodiments here disclosed, for linking the half-bridges, arising from the fact that the reduced number of bits present in each register 420 allows to specify the linking of a specific half-bridge to one and only one other half-bridge, thus, to designate a plurality of half-bridges that must be shut down simultaneously, the sequential chain-linking of multiple half-bridges is necessary.

Thus, in this embodiment, it is possible to obtain the same linking configuration in multiple ways using a reduced number of bits compared to other embodiments, i.e., smaller registers, e.g., 3-bit registers with 8 half-bridges.

Figure 5A:
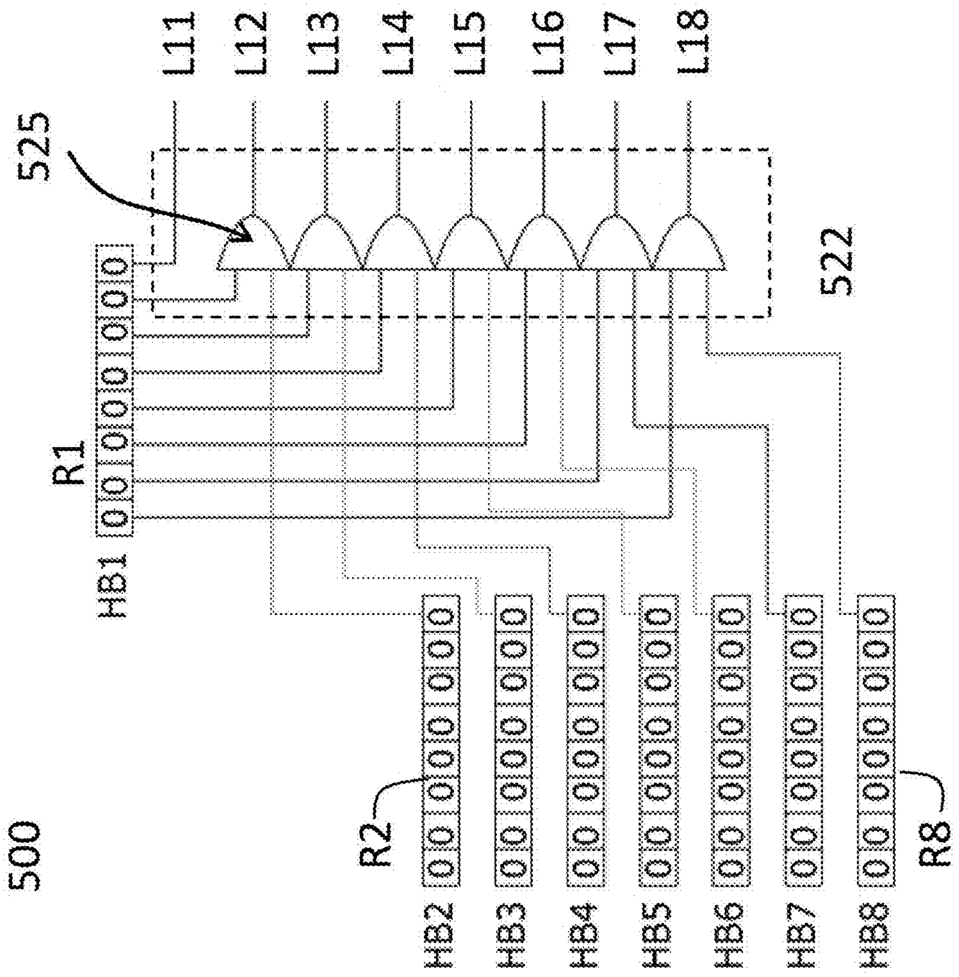
FIG. 5*a* shows schematically a third implementation of a decoding and linking circuit according to the solution here described.

FIG. 5*a* illustrates a further embodiment, showing a schematic of an implementation of a logic circuit 500 using one-hot half-bridge indexing. The one-hot indexing consists of associating a bit of each register R1 . . . R8 to each half-bridge HB1 . . . HB8 of the driving stage 101. In this embodiment, the registers R1 . . . R8 are indicated as a whole with the reference 510.

In this embodiment, each register $R_i$ associated with a respective half-bridge $HB_i$ comprises a number of bits equal to the maximum number of half-bridges that the driving stage 101 can control. Each bit of such register $R_i$, associated to a respective half-bridge $HB_i$, comprises a bit $B_j$ for each half-bridge $HB_i$, i.e., j=1 . . . 8, coupled to the pre-driving stage 101, each bit $B_j$ being representative of the linking between the half-bridge $HB_i$ associated to the register $R_i$ and of a half-bridge $HB_j$ addressed by the bit $B_j$ of the register $R_i$, i.e., associated to the bit $B_j$.

In particular, a j-th bit B in a given register $R_i$ is asserted, e.g. logic one, if the half-bridge $HB_i$ is linked to another half-bridge $HB_j$ identified by the position of the bit $B_j$ in the register Ri; the bit $B_j$ is instead de-asserted if the half-bridge $HB_j$ is not linked to the other half-bridge $HB_j$ identified by the position of the bit $B_j$ in the register $R_j$ or if the position of the bit $B_j$ in the register $R_i$ refers to the half-bridge $HB_i$ associated to the register $R_i$.

It is underlined that in the example of FIG. 5*a*, the values K in the registers R1 . . . R8 are all zeroes, i.e., not asserted, for simplicity's sake, while reduced examples with bit asserted in the values K are given concerning FIG. 5*b*.

A logic circuit 522, embodying in this embodiment the circuit 122, of logic circuit 500 processes the values stored in the registers 510 to determine which half-bridges must be shut down in case of a fault. In this exemplary embodiment, the logic circuit 522 to this purpose for each i-th half-bridge $HB_i$ (in the example HB1) comprises a plurality of AND gates 525. If N is the number of the half-bridges, in the example N=8, for each i-th half-bridge $HB_i$ there are N−1 AND gates 525. Each AND gate in the plurality 520 receives as input a bit of a register $R_i$ associated to such each i-th half-bridge $HB_i$, by a respective port of the pre-driving stage 101, indicating the link to a second j-th half-bridge $HB_j$ among the plurality of remaining half-bridges, in the Figure HB2 . . . HB8 (in general j is an index of the remaining half-bridges, thus it may take every value from 1 to N except j=i).

Each AND gate in the plurality of gates 525 also receives at its other input a bit of a register, e.g., Rj, associated to a respective j-th half-bridge $HB_j$ among the plurality of remaining half-bridges HB2 . . . HB8, indicating the link of such respective j-th half-bridge $HB_j$ to the i-th first half-bridge HB1, with its position in the register $R_j$. Such arrangement of bits allows the check of the link between two half-bridges $HB_i$, $HB_j$ using an AND operation between the bits. As mentioned, asserting a bit indicates that a half-bridge, i.e., the control signal through the port, is linked to another half-bridge addressed by the position of such bit in the register, whereas de-asserting a bit means that a half-bridge is not linked to another half-bridge indicated by the position of such bit in the register.

Each register associated with a specific half-bridge is comprised of a bit that points to the same specific half-bridge and is always de-asserted because linking a half-bridge with itself would not have any functional meaning.

As a result, the AND gate asserts the link between the two half-bridges if both the input bits are asserted, whereas if at least one of the input bits is de-asserted, there is no linking between the two half-bridges. This checking procedure must be iterated for each bit of each register in circuit 500. The outputs of the AND gates 525 may be used by a control circuit controlling the operation of the driving stage 101 to perform the same action, e.g., shut down, on the half-bridges linked by the signals asserted at such outputs.

If there are N half-bridges, there are N examples of the circuit shown in FIG. 5*a*, one for each half-bridge, i.e., there are 7×8=56 AND logic gates.

Figure 5B:
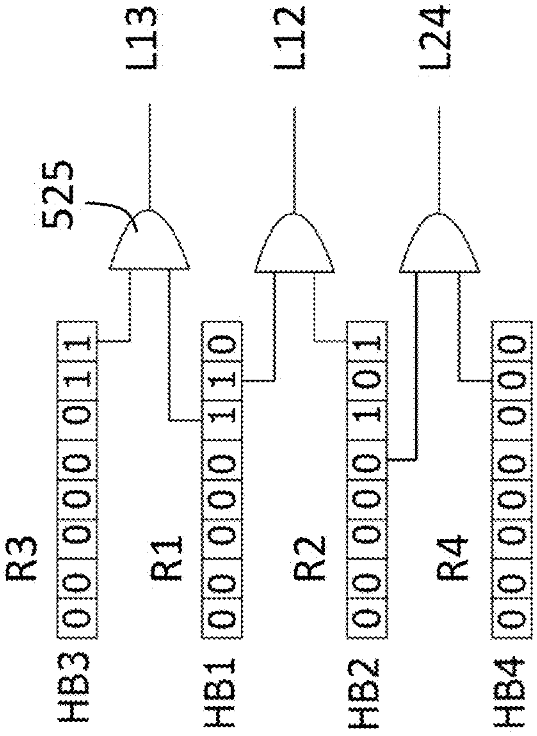
FIG. 5*b* shows a further schematic representation of the decoding and linking circuit of FIG. 5*a;*

In FIG. 5*b* it is disclosed a further example of the logic circuit 500, with four half-bridges, HB1 to HB4, and four respective registers R1 to R4, where in R3 is stored as value K '00000011', in R1 '00000110', in R2 '00000101' and in R4 '00000000'. As a consequence, the AND 525 coupling HB1 and HB3 outputs a link information L13 indicating that they are linked, the AND 525 coupling HB1 and HB2 outputs a link information L12 indicating that they are linked while the AND 525 coupling HB2 and HB4 outputs a link information L24 indicating that they are not linked.

This embodiment has the advantage that the circuitry of the decoding and linking logic circuit 500 can be kept relatively simple, thanks to the use of AND gates 525 only for checking whether two half-bridges are linked or not, without the need for further operations.

Thus, in general, given the disclosure above, the present solution provides a method, e.g., 200, for controlling a plurality of half-bridges, e.g., N half-bridges HB1 . . . $HB_N$, the controlling comprising, upon the occurrence of a given condition, in particular an anomalous behavior, performing a shutdown, e.g., step 203, of at least a half-bridge, e.g., i-th half-bridge $HB_i$, in the plurality of half-bridges, e.g., HB1 . . . $HB_N$.

Such method comprises associating, e.g., step 201, to each half-bridge, e.g., $HB_i$, of the plurality of half-bridges, e.g., HB1 . . . $HB_N$, a corresponding register, e.g., Ri, storing link information, e.g., a value K, in particular a binary string, indicating which other half-bridge or half-bridges in such plurality of half-bridges, e.g., HB1 . . . $HB_N$ is linked to the half-bridge, e.g., $HB_i$, decoding, e.g., step 202, the link information K obtaining a decoded link information, e.g., L, indicating which other half-bridge or half-bridges in the plurality of half-bridges HB1 . . . $HB_N$ is linked to the half-bridge $HB_i$, i.e., the one determining the occurrence of the given condition, e.g., anomaly or failure, performing the shutting down, e.g., step 203, on the at least half-bridge $HB_i$ and the other half-bridge or half-bridges in the plurality of half-bridges HB1 . . . $HB_N$ is indicated as linked to the half-bridge $HB_i$ by the decoded link information, e.g., L.

In embodiments, the associating step e.g., 201, comprises storing as link information, K, one or more key values K, e.g. identifiers, belonging to a determined set of keys associated to the plurality of half-bridges HB1 . . . $HB_N$, such set being as explained a subset of the N possible binary keys, the decoding, e.g., 202, the link information K comprises extracting the one or more keys from the register $R_i$ of at least a half-bridge $HB_i$ and comparing to keys extracted from other registers associated to other half-bridges in the plurality of half-bridges HB1 . . . $HB_N$, i.e. comparing their identifiers, performing the shutting down, e.g., 203) on the half-bridges in which registers are stored the same keys K stored in the register $R_i$ of at least a half-bridge $HB_i$.

The storing as link information K one or more key values belonging to a determined set of keys associated to the plurality of half-bridges HB1 . . . $HB_N$ comprises using registers having a length of at least half of the number N of half-bridges in the plurality of half-bridges HB1 . . . $HB_N$, selecting as determined set of keys, a number of keys half of the number N of half-bridges in the plurality of half-bridges HB1 . . . $HB_N$, each key in the number of keys having a single binary digit asserted, different from any other key in the subset of keys.

Also, the step of decoding, e.g., 202, comprises performing bitwise AND 330 logic operation between the one or more keys K stored in respective registers of a pair of half-bridges to a plurality of AND gates, e.g., 330, performing logic OR operations, e.g., 340, on each result of a bitwise AND operation, e.g. 335 or collectively 330, of a pair of half-bridges, each OR operation outputting a decoded link information, e.g. L or Lij, indicating if the respective pair of half-bridge is linked or not, in particular the link information L being a binary or two value signal (es, good no good), where assertion means presence of a link, the half-bridges linked have to be shut down together, and de-assertion absence of a link.

Another embodiment, as explained, has the step of associating, e.g., 201 to each half-bridge, e.g., $HB_i$ of the plurality of half-bridges, e.g., HB1 . . . $HB_N$ a corresponding register, e.g., $R_i$ storing link information, e.g., K, further comprises, using a corresponding register, e.g., R comprising a number of bits corresponding to a number, e.g., N of the plurality of half-bridges, e.g., HB1 . . . $HB_N$, associating to each a half-bridge, e.g., $HB_i$, of the plurality of half-bridges, e.g., HB1 . . . $HB_N$ a bit, e.g., B of the respective value stored in the register, e.g., R, the bit, e.g., B being asserted if the half-bridge, e.g., HB1 is linked to another half-bridge, e.g., HB2 identified by the position of the bit, e.g., B in the register, e.g., R, the bit, e.g., B being de-asserted if the half-bridge, e.g., HB1 is not linked to the other half-bridge, e.g., HB2 identified by the position of the bit, e.g., B in the register, e.g., R or if the position of the bit, e.g., B in the register, e.g., R identifies to the half-bridge, e.g., HB itself, decoding, e.g., 202 the link information, e.g., K obtaining a decoded link information indicating which other half-bridge in the plurality of half-bridges, e.g., HB1 . . . $HB_N$ is linked to the half-bridge, e.g., $HB_i$ comprises obtaining as decoded link information the position of one or more asserted bits, e.g., B in the register, e.g., $R_i$ and then performing shutting down the one or more half-bridges identified by the position of the one or more asserted bits, e.g., B.

As shown in FIGS. 5*a*, 5*b*, the decoding comprises performing at least an AND operation, e.g., 520 or 525, between a selected bit of a register, e.g. Ri and a selected bit of one or more other registers, e.g. Rj. As shown in FIG. 5*a*, selected may mean that each bit of register Ri is AND-ed with the bit whose position corresponds to it, i.e., Ri, in all the other registers, and this can be replicated to all other registers, performing AND on all the possible combination of bits. Also, as shown in FIG. 5*b*, selected may mean that only bits pertaining to certain links are brought as input to an AND gate.

The decoding is performed by a simple logic circuit, as described in FIG. 5*a*, using a plurality of AND gates 520, where each AND gate in the plurality 520 receives as input a bit of a register $R_i$ associated to such each i-th half-bridge $HB_i$, by a respective port of the driving stage 101, indicating the link to a second j-th half-bridge $HB_j$ among the plurality of remaining half-bridges, in the Figure HB2 . . . HB8 (in general, j is an index of the remaining half-bridges; thus, it may take every value from 1 to N except j=i). Each AND gate in the plurality of gates 525 also receives at its other input a bit of a register, e.g., Rj, associated to a respective jth half-bridge $HB_j$ among the plurality of remaining half-bridges HB2 . . . HB8, indicating the link of such respective j-th half-bridge $HB_j$ to the i-th first half-bridge HB1, with its position in the register $R_j$ In a further embodiment the step of associating, e.g., 201 to each half-bridge, e.g., $HB_i$ of the plurality of half-bridges, e.g., HB1 . . . $HB_N$ a corresponding register, e.g., $R_i$ storing link information, e.g., K. further comprises: associating to each half-bridge of the plurality of half-bridges, e.g., HB1 . . . $HB_N$ a respective address value stored in the register, e.g., R as link information, e.g., K is an address value of another half-bridge, e.g., HB2 to which is linked for shut down, in particular the value, e.g., K having a number of bits equal to the binary logarithm of a number, e.g., N of half-bridges, e.g., N in the plurality of half-bridges, e.g., HB1 . . . $HB_N$, the decoding, e.g., 202 the link information, e.g., K comprising reading the addresses value stored in the plurality of half-bridges, e.g., HB1 . . . $HB_N$, identifying the half-bridges linked by the address values, both directly or linked indirectly through one or more other half-bridge, e.g. indirectly meaning that a chain of link between two half-bridges with interposed one or more other half-bridges can be established, performing shut down of the half-bridge linked directly or indirectly to the at least a half-bridge, e.g., $HB_i$ to be shut down.

Thus, based on the description above, the solution's operation and advantages are clear.

The solution described advantageously provides a more flexible pre-driving circuit, able to deactivate a desired subset of half-bridges if an anomaly is detected, which could be, for example, a subset of half-bridges forming one or more H-bridges driving a load, in such a way that not only a defective half-bridge is switched off, but also the other half-bridges that work in cooperation with the defective half-bridge. In this way, it is possible, for example, to completely turn off a full H-bridge comprising a faulty half-bridge and a working one, thus obtaining better power efficiency because also the working half-bridge is deactivated, thus avoiding driving the load at a reduced duty cycle. In other cases, wherein an anomaly could occur in the load driven by one or more half-bridges, the present solution allows to conveniently shutting down all the half-bridges related to the operation of driving such faulty load, thus avoiding keeping undesired parts of the systems turned on, which may cause increased power consumption and further damage to the system, while keeping contemporarily the working loads and respective half-bridges connected to the same pre-driving stage activated.

Various figures depict circuits and other components with block Figures. These Figures should not be taken to mark the physical boundaries of the corresponding components. As will be appreciated, physical components may be dispersed throughout a SoC.

While this invention has been described concerning illustrative embodiments, this description is not intended to be construed in a limiting sense. Various modifications and combinations of the exemplary embodiments and other embodiments of the invention will be apparent to persons skilled in the art upon reference to the description. Therefore, the appended claims are intended to encompass any such modifications or embodiments.

What is claimed is:

1. A method for controlling a plurality of half-bridges, the method comprising:

associating with each half-bridge in the plurality of half-bridges a corresponding register storing associated link information indicating which other half-bridge or half-bridges are linked thereto;

determining an anomalous behavior in a first half-bridge;

decoding a link information in a first register of the first half-bridge to determine which other half-bridge or half-bridges in the plurality of half-bridges are linked to the first half-bridge; and shutting down the first half-bridge and the other half-bridge or half-bridges linked to the first half-bridge based on the decoded link information.

2. The method of claim 1, wherein associating to each half-bridge the corresponding register comprises storing as link information one or more key values belonging to a determined set of keys associated to the plurality of half-bridges, wherein decoding the link information comprises:

extracting one or more keys from the first register, comparing the one or more keys to keys extracted from other registers associated with other half-bridges in the plurality of half-bridges, and shutting down each half-bridge in the plurality of half-bridges in which its corresponding register stores the same keys stored in the first register of the first half-bridge.

3. The method of claim 2, wherein storing as link information one or more key values belonging to the determined set of keys associated with the plurality of half-bridges comprises selecting a predetermined set of keys corresponding to a number of keys half of the number of half-bridges in the plurality of half-bridges, each key in the number of keys having a single binary digit asserted and different from any other key in a subset of keys.

4. The method of claim 2, wherein decoding the link information comprises:

performing a bitwise AND logic operation between the one or more keys stored in respective registers of a pair of half-bridges; and performing logic OR operations on each result of a bitwise AND operation of a pair of half-bridges, each OR operation outputting a decoded link information indicating whether the respective pair of half-bridge is linked.

5. The method of claim 1, wherein associating to each half-bridge the corresponding register storing associated link information comprises:

selecting a register comprising a number of bits corresponding to a number of the plurality of half-bridges;

associating with each half-bridge a bit of the respective value stored in the selected register, the bit asserted in response to the half-bridge being linked to another half-bridge identified by the position of the bit in the register, the bit de-asserted in response to the half-bridge not being linked to the other half-bridge identified by the position of the bit in the register or in response to the position of the bit in the register identified with the half-bridge;

decoding the link information by obtaining as decoded link information a position of one or more asserted bits in the selected register; and shutting down the first half-bridge and the other half-bridge or half-bridges identified by the position of one or more asserted bits.

6. The method of claim 1, wherein decoding the link information comprises performing an AND operation between a selected bit of the first register and a selected bit of one or more other registers.

7. The method of claim 1, wherein associating with each half-bridge in the plurality of half-bridges a corresponding register storing associated link information:

associating with each half-bridge a respective address value, and storing in the first register, as link information, an address value of another half-bridge to which is linked for shut down, the address value having a number of bits equal to a binary logarithm of a number of half-bridges in the plurality of half-bridges, wherein decoding the link information comprises:

reading the address value stored in the plurality of half-bridges, identifying the half-bridges linked by the address value directly or indirectly linked through one or more other half-bridges, shutting down the half-bridge linked directly or indirectly to the first half-bridge.

8. The method of claim 7, wherein decoding the link information comprises supplying the read addresses to a decoding and linking circuit configured to select the half-bridges directly or indirectly linked through one or more other half-bridges.

9. The method of claim 8, wherein the decoding the link information comprises:

obtaining the link information as a link matrix;

accessing link information values stored in the first register and initializing a square matrix;

reading the link information values from the first register, one at a time;

asserting a bit value at a row and column corresponding to a link information value of the link information values indicating a link between two given half-bridges;

repeating the operation for each value in the register;

performing an iterative symmetrization of a matrix row by row by asserting logic values and maintaining logic values;

saving the symmetrized matrix; and returning to the accessing operation in response to receiving a reset signal.

10. The method of claim 1, wherein to shut-down the other half-bridge or half-bridges linked to the first half-bridge comprises detecting if one or more of the half-bridges among the plurality of half-bridges have an anomalous behavior.

11. A device for controlling a plurality of half-bridges used to drive one or more loads, the device comprising:

a plurality of ports, each port configured to couple to a respective half-bridge in the plurality of half-bridges and to send control signals for operating the respective half-bridge;

a logic circuit comprising a plurality of registers, each register associated with a respective half-bridge and configured to store link information indicating which other half-bridge or half-bridges are linked to the respective half-bridge; and a decoding circuit configured to:

determine an anomalous behavior in a first half-bridge, decode the link information stored in a first register associated with the first half-bridge to determine which other half-bridge or half-bridges in the plurality of half-bridges are linked to the first half-bridge, and generate shut-down signals for the first half-bridge and the other half-bridge or half-bridges linked to the first half-bridge based on the decoded link information; and a control circuit configured to send the shut-down signals via the respective ports to the first half-bridge and the other half-bridge or half-bridges linked to the first half-bridge.

12. The device of claim 11, wherein the logic circuit comprises an interface coupling the device with an external microcontroller.

13. The device of claim 11, wherein the device includes a finite state machine configured to perform the decoding.

14. The device of claim 11, wherein the plurality of half-bridges is arranged externally with respect to a driving stage.

15. The device of claim 11, wherein each port is coupled to control terminals of high-side and low-side switches of each half-bridge of the plurality of half-bridges.

16. An integrated circuit for controlling a plurality of external half-bridges used to drive one or more loads, the integrated circuit comprising:

a plurality of output drivers, each output driver configured to generate control signals for operating a respective external half-bridge;

a register array comprising a plurality of registers, each register associated with a respective external half-bridge and configured to store link information indicating which other external half-bridge or half-bridges are linked thereto;

a combinational logic circuit coupled to the register array and configured to:

perform bitwise operations on the link information stored in the registers to determine linkages between the external half-bridges, and generate linkage indicators based on the bitwise operations; and a control logic circuit coupled to the combinational logic circuit and the plurality of output drivers, the control logic circuit configured to:

receive a fault signal indicating an anomaly in a first external half-bridge, process the linkage indicators to identify linked external half-bridges, and instruct the output drivers to generate shut-down signals for the first external half-bridge and the linked external half-bridges.

17. The integrated circuit of claim 16, wherein the combinational logic circuit comprises:

a plurality of AND gates, each AND gate configured to perform a bitwise AND operation between link information stored in registers associated with a pair of external half-bridges; and a plurality of OR gates, each OR gate coupled to outputs of a subset of the AND gates and configured to generate a linkage indicator for a respective pair of external half-bridges.

18. The integrated circuit of claim 16, further comprising a fault detection circuit coupled to the control logic circuit and configured to:

monitor operating parameters of the external half-bridges; and generate the fault signal when an operating parameter exceeds a predetermined threshold.

19. The integrated circuit of claim 16, wherein the register array is programmable, and the integrated circuit further comprises a serial interface configured to:

receive link configuration data from an external microcontroller; and update the link information stored in the registers based on the received link configuration data.

20. The integrated circuit of claim 16, wherein the control logic circuit further comprises:

a state machine configured to sequentially process the linkage indicators; and generate a shut-down sequence for the linked external half-bridges, wherein the shut-down sequence defines a specific order in which the linked external half-bridges are to be disabled.

* * * * *